United States Patent [19]
Furuya et al.

[11] Patent Number: 6,084,215
[45] Date of Patent: Jul. 4, 2000

[54] SEMICONDUCTOR WAFER HOLDER WITH SPRING-MOUNTED TEMPERATURE MEASUREMENT APPARATUS DISPOSED THEREIN

[75] Inventors: Kunihiro Furuya, Nirasaki; Toshihiro Yonezawa, Yamanashi-ken; Ken Inoue, Yamanashi-ken; Yoichi Nakagomi, Yamanashi-ken, all of Japan

[73] Assignee: Tokyo Electron Limited, Tokyo, Japan

[21] Appl. No.: 09/179,192

[22] Filed: Oct. 27, 1998

[30] Foreign Application Priority Data

| Nov. 5, 1997 | [JP] | Japan | 9-318918 |
| Nov. 5, 1997 | [JP] | Japan | 9-318919 |
| Nov. 5, 1997 | [JP] | Japan | 9-318920 |
| Nov. 5, 1997 | [JP] | Japan | 9-318921 |
| Nov. 5, 1997 | [JP] | Japan | 9-318922 |

[51] Int. Cl.[7] .......................... H01L 21/205; H01L 21/66
[52] U.S. Cl. .................. 219/444.1; 219/448.11; 219/385; 118/725; 118/728; 118/500; 374/208; 324/765; 324/760
[58] Field of Search ...................... 219/494, 497, 219/444.1, 448.11–448.19, 385; 324/760, 761, 765; 427/374.1; 118/52, 56, 724–725, 728–730, 50.1, 500; 269/21; 156/626; 374/208

[56] References Cited

U.S. PATENT DOCUMENTS

| 4,147,571 | 4/1979 | Stringfellow et al. ................. 118/724 |
| 4,351,996 | 9/1982 | Kondo et al. ............................ 219/518 |
| 4,551,192 | 11/1985 | Di Millia et al. ....................... 156/345 |
| 4,788,416 | 11/1988 | Price et al. .............................. 219/516 |
| 4,944,860 | 7/1990 | Bramhall, Jr. et al. ................. 118/500 |
| 4,955,590 | 9/1990 | Narushima et al. ...................... 269/21 |
| 5,183,402 | 2/1993 | Cooke et al. ............................ 432/231 |
| 5,231,690 | 7/1993 | Soma et al. ............................. 392/416 |
| 5,238,499 | 8/1993 | Ven et al. ................................. 118/724 |
| 5,294,778 | 3/1994 | Carman et al. ......................... 219/385 |
| 5,366,002 | 11/1994 | Tepman .................................... 118/728 |
| 5,570,032 | 10/1996 | Atkins et al. . |
| 5,656,945 | 8/1997 | Cain ......................................... 324/765 |
| 5,730,801 | 3/1998 | Tepman et al. ......................... 118/729 |
| 5,756,157 | 5/1998 | Kannan et al. ...................... 427/374.1 |
| 5,811,762 | 9/1998 | Tseng ....................................... 118/728 |
| 5,844,208 | 12/1998 | Tustaniwskyz et al. ................ 219/494 |
| 5,885,353 | 3/1999 | Strodtbeck et al. .................... 118/712 |

FOREIGN PATENT DOCUMENTS

| 4-219921 | 8/1992 | Japan . |
| 7-231019 | 8/1995 | Japan . |
| 8-5666 | 1/1996 | Japan . |
| 8-340030 | 12/1996 | Japan . |

*Primary Examiner*—John A. Jeffery
*Attorney, Agent, or Firm*—Oblon, Spivak, McClelland, Maier & Neustadt, P.C.

[57] ABSTRACT

A temperature measuring unit of a wafer chuck measures the temperature of a wafer chuck when the wafer chuck holding a wafer W making in-unison contact with a contactor is made to contact a bottom jacket and the bottom jacket controls the wafer W to a specific test temperature. At least three recessed sections are formed in the back of the wafer chuck in such a manner that they have a depth extending from the back of the chuck to the vicinity of its surface. Through holes corresponding to the recessed sections are made in the bottom jacket. Temperature sensors that can be inserted into the through holes and in the recessed sections are provided on the side opposite to the wafer chuck of the bottom jacket. The sensors are supported by springs. During a test, the tips of the temperature sensors are caused to make elastic contact with the recessed sections.

6 Claims, 8 Drawing Sheets

SEMICONDUCTOR WAFER HOLDER WITH SPRING-MOUNTED TEMPERATURE MEASUREMENT APPARATUS DISPOSED THEREIN

BACKGROUND OF THE INVENTION

This invention relates to a semiconductor wafer holding apparatus, and more particularly to a semiconductor wafer holding apparatus applied to an electrical characteristic test unit and reliability test unit for semiconductors (hereinafter, referred to as chips) formed on a semiconductor wafer (hereinafter, referred to as a wafer).

Furthermore, the invention relates to a semiconductor wafer storage chamber which houses a semiconductor wafer holding apparatus.

The process of manufacturing semiconductors requires the technique for transferring wafers from one manufacturing process to another. The technique has been used in a mechanism for transferring wafers in units of carrier and in a mechanism for transferring wafers one by one. As the number of the steps of processing wafers with larger diameters one by one, or the number of sheet-feeding processes, has been increased, the number of the processes of transferring wafers one by one has been increased.

The processes of manufacturing semiconductors include various testing processes. For instance, an electrical characteristic test unit checks a large number of chips formed on a semiconductor wafer for electrical characteristics. On the basis of the result of the test, screening is effected to obtain acceptable chips with the nondefective electrical characteristic. In the assembly process, the screened acceptable chips are packaged with synthetic resin or ceramic.

A reliability test unit checks packaged products for potential defects in the chips by applying temperature and electrical stresses. On the basis of the result of the test, defective products are removed.

As electrical products have been getting miniaturized and sophisticated, chips have been further miniaturized and integrated. In recent years, various mounting technologies for further miniaturizing semiconductor products have been developed. Especially, the technique for mounting unpackaged chips, or chips, has been developed. To put chips on the market, the chips have to be guaranteed quality. For this reason, chips are checked for reliability.

A probing apparatus may be used for a reliability test. With the probing apparatus, however, wafers have to be checked one by one and a lot of time is needed to test one wafer. Therefore, the reliability test using the probing apparatus has a cost problem. In the case of a chip test using a conventional burn-in unit, various difficult problems including an electrical connection between chips and sockets must be solved. The way of handling small chips is very complicated, which can lead to an increase in testing cost.

Therefore, an electrical characteristic test unit and a reliability test unit which have solved the above problems have been wanted.

Reliability test techniques have been proposed in, for example, Jpn. Pat. Appln. KOKAI Publication No. 7-231019, Jpn. Pat. Appln. KOKAI Publication No. 8-5666, Jpn. Pat. Appln. KOKAI Publication No. 8-340030. Of these publications, the first two have disclosed the technique for causing a contactor, such as a probe sheet (e.g., an anisotropic conductive sheet), to make in-unison contact with the chips formed on a wafer reliably without the influence of temperature.

To carry out a reliability test while assuring reliability, it is very important for the contactor to make in-unison contact with the chips on the wafer at high temperatures reliably.

It is also very important to raise the temperature of the wafer in a constant-temperature oven efficiently to a test temperature and keep the test temperature accurately.

Although various techniques for causing a contactor to make in-unison contact with a wafer have been proposed, the technique for controlling the temperature in a constant-temperature oven during a test is not yet fully developed. This has caused the problem of making it difficult to measure the temperature of the wafer accurately during a test and decreasing the reliability of the test.

Before the process of causing a contactor to make in-unison contact with a wafer, it is important for a wafer to be moved smoothly from a transfer mechanism onto a wafer holding table. In a conventional wafer holding table, sufficient steps to cause a wafer to be transferred smoothly from the transfer mechanism have not been taken.

Furthermore, because the wafer holding table in the reliability test unit has been designed for reliability test only, this makes it difficult to use the table in other test units, leading to the poor flexibility.

The technique for causing a contactor to make in-unison contact with the chips on a wafer gives rise to problems with not only the relationship between the contactor and the wafer but also the relationship between the contactor and the construction of the wafer storage chamber. The inventors of the present invention have developed the technique for forming a contactor separately from a wafer storage chamber and causing the contactor to make in-unison contact with a wafer outside the wafer storage chamber and the technique for providing pogo pins to connect the contactor to the electric wiring (the junction terminals) in the wafer storage chamber. The electrical connection technique using pogo pins has the disadvantage that temperature rise during a test prevents the pogo pins from coming into contact with the contactors stably.

BRIEF SUMMARY OF THE INVENTION

An object of the present invention is to provide a wafer holding apparatus capable of measuring the temperature of a wafer accurately in an electrical characteristic test and reliability test for chips and improving the reliability of test.

Another object of the present invention is to provide a wafer holding table capable of receiving and giving a wafer smoothly from and to a transfer mechanism.

Another object of the present invention is to provide a wafer holding table capable of being also used as a wafer transfer carrier.

Another object of the present invention is to provide a wafer holding apparatus including a wafer holding table suitable to cause a contactor to make in-unison contact with the chips on a wafer.

Another object of the present invention is to provide a highly reliable wafer holding apparatus capable of causing a contactor to come into contact with the junction terminals in a wafer storage chamber stably even during an inspection or a test.

Another object of the present invention is to provide a wafer storage chamber suitable for an electrical characteristic test and reliability test for chips.

According to a first aspect of the present invention, there is provided a semiconductor wafer holding apparatus comprising: a semiconductor wafer holding table for holding a semiconductor wafer, the semiconductor wafer holding table having a surface on which a semiconductor wafer is to be placed and at least one recessed section therein, the recessed section having a depth reaching close to the surface; a temperature measuring mechanism for measuring the temperature of the semiconductor wafer holding table, the temperature measuring mechanism including at least one temperature sensor and a first elastic support member which supports the temperature sensor, allows the temperature sensor to pass through the through hole in the temperature control mechanism, and fits the temperature sensor in the recessed section of the semiconductor wafer holding table; and a temperature control mechanism for controlling the temperature of the semiconductor wafer placed on the semiconductor wafer holding table, the temperature control mechanism controlling the temperature of the semiconductor wafer holding table while making contact with the side opposite to the surface of the semiconductor wafer holding table, supporting the semiconductor wafer holding table, and having at least one through hole in a position corresponding to the recessed section.

According to a second aspect of the present invention, there is provided a semiconductor wafer holding apparatus comprising: a contactor including a plurality of conducting means that make electrical contact, in unison and separately, with specific electrodes of semiconductor elements formed on a semiconductor wafer and external terminals electrically connected to the conducting means; a semiconductor wafer holding table for holding the semiconductor wafer in contact with the contactor, the semiconductor wafer holding table having a surface on which a semiconductor wafer is to be placed and at least one recessed section therein, the recessed section having a depth reaching close to the surface; a temperature measuring mechanism for measuring the temperature of the semiconductor wafer holding table, the temperature measuring mechanism including at least one temperature sensor and a first elastic support member which supports the temperature sensor, allows the temperature sensor to pass through the through hole in the temperature control mechanism, and fits the temperature sensor in the recessed section of the semiconductor wafer holding table; and a temperature control mechanism for controlling the temperature of the semiconductor wafer placed on the semiconductor wafer holding table, the temperature control mechanism controlling the temperature of the semiconductor wafer holding table while making contact with the side opposite to the surface of the semiconductor wafer holding table, supporting the semiconductor wafer holding table, and having at least one through hole in a position corresponding to the recessed section.

It is desirable that the temperature measuring mechanism should be provided with a sensor for sensing the position of at least one temperature sensor.

According to a third aspect of the present invention, there is provided a semiconductor wafer holding apparatus comprising: a contactor including a plurality of conducting means that make electrical contact, in unison and separately, with specific electrodes of semiconductor elements formed on a semiconductor wafer and external terminals electrically connected to the conducting means; a semiconductor wafer holding table for holding the semiconductor wafer in contact with the contactor; a temperature measuring mechanism for measuring the temperature the semiconductor wafer holding table; and a temperature control mechanism for controlling the semiconductor wafer placed on the semiconductor wafer holding table, the temperature control mechanism being supported by a support mechanism which includes a base in which through holes are made, rods that penetrate through the through holes in the base and are secured to the temperature control mechanism and that guide the base in such a manner the base can move relatively with respect to the temperature control mechanism, and a second elastic support member for supporting the temperature control mechanism elastically in a manner that leaves a space between the temperature control mechanism and the base.

It is desirable that the second elastic support member should be coil-like springs wound around the rods.

According to a fourth aspect of the present invention, there is provided a semiconductor wafer holding apparatus comprising: a contactor including a plurality of conducting means that make electrical contact, in unison and separately, with specific electrodes of semiconductor elements formed on a semiconductor wafer and external terminals electrically connected to the conducting means; a semiconductor wafer holding table for holding the semiconductor wafer in contact with the contactor; a temperature measuring mechanism for measuring the temperature of the semiconductor wafer holding table; and a temperature control mechanism for controlling the semiconductor wafer placed on the semiconductor wafer holding table, the temperature control mechanism including a heating element provided inside the mechanism and near the surface of the mechanism, a cooling passage which is provided in the mechanism with a clearance from the heating element and through which a refrigerant passes, a heat resistance sheet provided between the cooling passage and the heating element, and a control unit for controlling the amount of heating by the heating element and the amount of cooling by the refrigerant on the basis of the sense signal from the temperature measuring mechanism, and the temperatures control mechanism making contact with the semiconductor wafer table to support the table and controls the temperature of the table.

It is desirable that the control unit for controlling the amount of heating by the heating element and the amount of cooling by the refrigerant should be a PID adjuster.

It is desirable that the semiconductor wafer holding table has a surface on which a semiconductor wafer is to be placed and at least one recessed section having a depth extending from the opposite side of the surface to the vicinity of the surface; the temperature control mechanism controls the temperature of the semiconductor wafer holding table while making contact with the side opposite to the surface of the semiconductor wafer holding table, supports the semiconductor wafer holding table, and has at least one through hole in a position corresponding to the recessed section of the semiconductor wafer table; and the temperature measuring mechanism includes at least one temperature sensor and a first elastic support member which supports the temperature sensor, allows the temperature sensor to pass through the through hole in the temperature control mechanism, and fits the temperature sensor in the recessed section of the semiconductor wafer holding table.

It is desirable that the refrigerant should be water.

According to a fifth aspect of the present invention, there is provided a semiconductor wafer holding apparatus comprising:

a semiconductor wafer holding table including a body on which a semiconductor wafer is to be placed, the body including holes which allow pins for receiving and giving the semiconductor wafer to move up and down, and a seal film which covers the holes and expands and contracts as the pins go up and down; and a mechanism for adhering to the semiconductor wafer by vacuumization.

It is desirable that the seal film should be made of silicone rubber and be in the form of a cylinder whose tip is sealed and whose bottom end is open.

According to a sixth aspect of the present invention, there is provided a semiconductor wafer storage chamber for housing a semiconductor wafer holding apparatus, the semiconductor wafer storage chamber comprising a support plate below the chamber, the support plate having a hole in which the semiconductor wafer holding apparatus is placed and is divided radially in plural directions with the hole in its center, the semiconductor wafer holding apparatus comprising a contactor including a plurality of conducting means that make electrical contact, in unison and separately, with specific electrodes of semiconductor elements formed on a semiconductor wafer and external terminals electrically connected to the conducting means; a semiconductor wafer holding table for holding the semiconductor wafer in contact with the contactor; a temperature measuring mechanism for measuring the temperature of the semiconductor wafer holding table, and a temperature control mechanism for controlling the semiconductor wafer placed on the semiconductor wafer holding table.

It is desirable that the support plate should be made of synthetic resin.

According to a seventh aspect of the present invention, there is provided a semiconductor wafer storage chamber for housing a semiconductor wafer holding apparatus, the semiconductor wafer storage chamber having a support plate below the chamber, the support plate having junction terminals in positions corresponding to the external terminals of the contactor, and the junction terminals being connected to a measuring unit for measuring the electrical characteristics of the semiconductors formed on the semiconductor wafer, and the semiconductor wafer holding apparatus comprising: a contactor including a plurality of conducting means that make electrical contact, in unison and separately, with specific electrodes of semiconductor elements formed on a semiconductor wafer and external terminals electrically connected to the conducting means; a semiconductor wafer holding table for holding the semiconductor wafer in contact with the contactor, the semiconductor wafer holding table having a surface on which a semiconductor wafer is to be placed and at least one recessed section therein, the recessed section having a depth reaching close to the surface; a temperature measuring mechanism for measuring the temperature of the semiconductor wafer holding table, the temperature measuring mechanism including at least one temperature sensor and a first elastic support member which supports the temperature sensor, allows the temperature sensor to pass through the through hole in the temperature control mechanism, and fits the temperature sensor in the recessed section of the semiconductor wafer holding table; and a temperature control mechanism for controlling the semiconductor wafer placed on the semiconductor wafer holding table, the temperature control mechanism controlling the temperature of the semiconductor wafer holding table while making contact with the side opposite to the surface of the semiconductor wafer holding table, supporting the semiconductor wafer holding table, and having at least one through hole in a position corresponding to the recessed section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, the present invention will be explained using embodiments of the present invention shown in FIGS. 1 to 10B.

Figure 1:
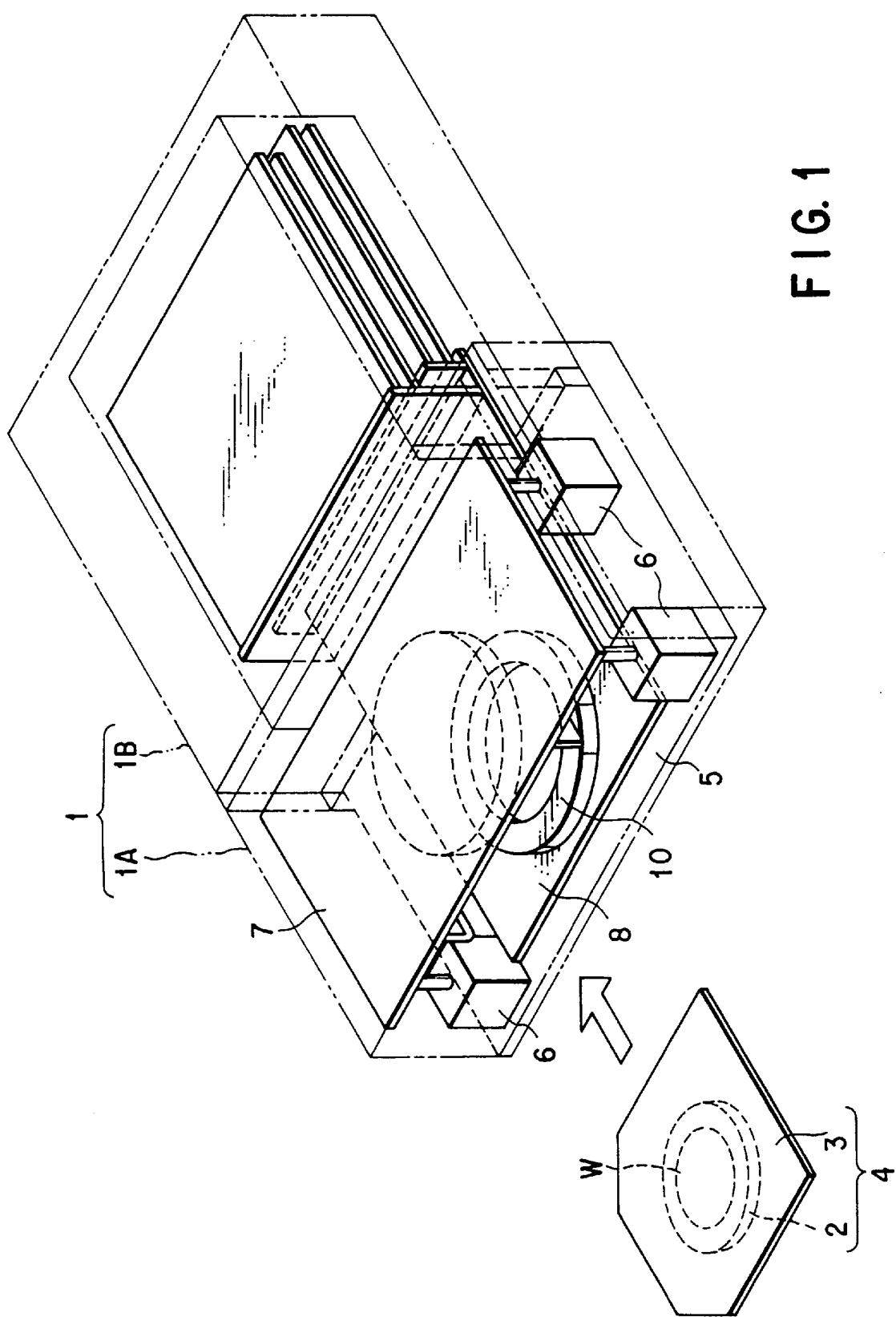
FIG. 1 is a perspective view of an embodiment of a wafer storage chamber including a semiconductor wafer holding apparatus according to the present invention.

A wafer storage chamber 1 in an embodiment of the present invention is in the form of a flat rectangle as a whole as shown in FIG. 1. Many rows and columns of wafer storage chambers 1 are arranged horizontally in a frame (not shown) of, for example, a rack-like reliability test unit.

In carrying a reliability test for a wafer, a wafer W is integrated with a contactor 3 into a single entity on a wafer holding table (hereinafter, referred to as a wafer chuck) 2. In this state, each wafer W is put in each wafer storage chamber 1. The state where the wafer W has been integrated with the contactor 3 means a state where the test electrodes (hereinafter, referred to as electrode pads) of many chips formed on the top surface of the wafer W make in-unison contact with the test terminals 3A on the contactor 3 respectively, thereby connecting the electrode pads to the test terminals electrically. Hereinafter, for the sake of convenience, a structure where the wafer W, wafer chuck 2, and contactor have been integrated into an entity and these are referred to as a shell 4.

As shown in FIG. 1, the wafer storage chamber 1 is composed of a temperature control compartment 1A and a connector compartment 1B adjacent to the temperature control compartment 1A. Between the compartments 1A and 1B, a heat insulation wall (not shown) is provided. The heat insulation wall prevents the rise of the temperature in the connector compartment 1B as much as possible. In the temperature control compartment 1A, the temperature of the wafer W is kept at a test temperature and the temperate around the wafer W is forced to rise as little as possible.

In the temperature control compartment 1A, a base 5 is provided. In the four corners of the base 5, cylinder mechanisms 6 are provided. The top ends of the cylinder rods of the respective cylinder mechanisms 6 are coupled with the four corners of a pressure plate 7 provided above the base 5. On the back of the pressure plate 7, a clamp mechanism (not shown) is provided. The clamp mechanism receives a shell 4. In the connector compartment 1B, a connector connected to a tester (not shown) and a wiring board connected to the connector are provided.

Figure 2:
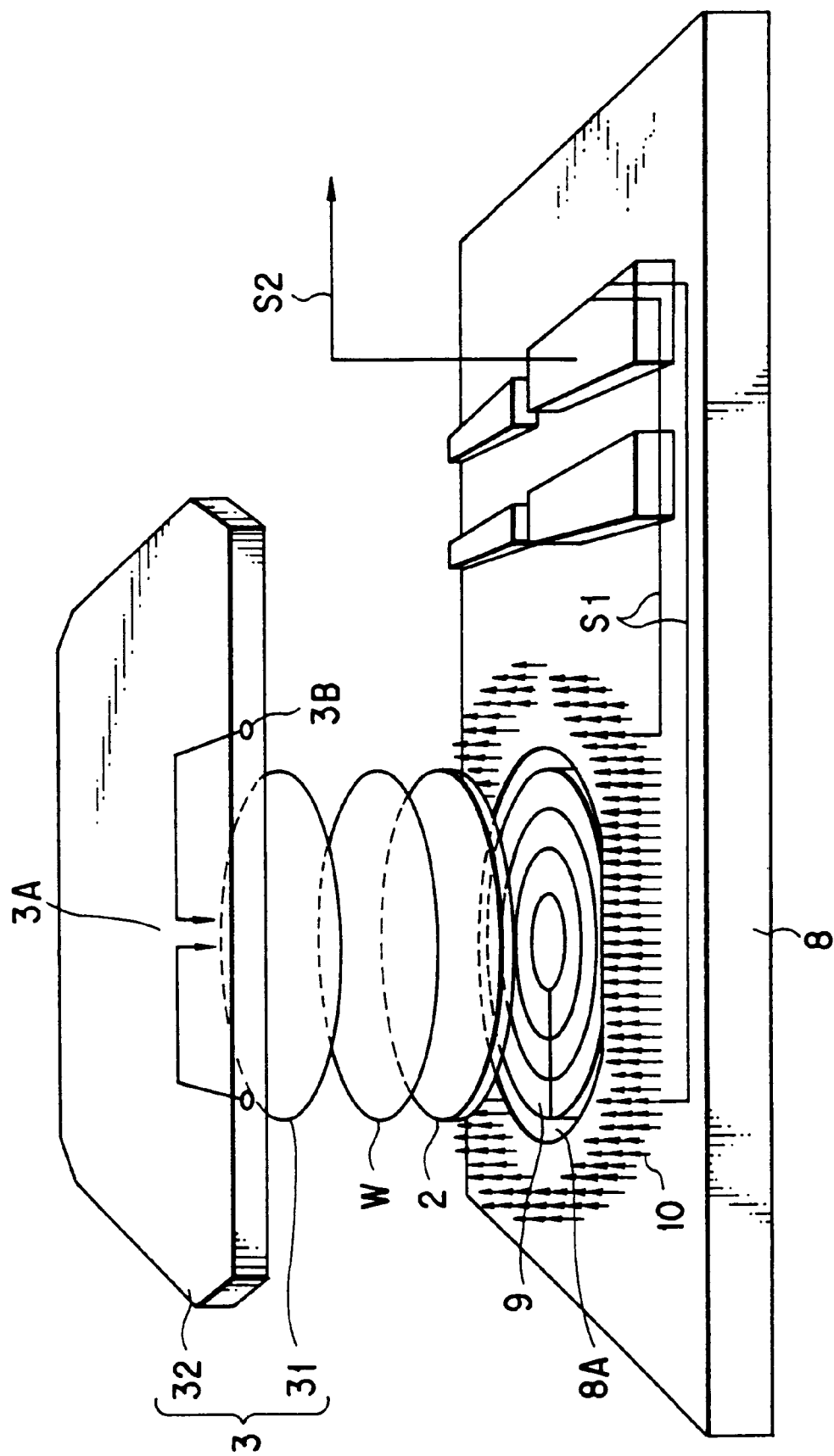
FIG. 2 is an exploded perspective view to help explain how signals are transmitted during a reliability test in the wafer storage chamber of FIG. 1.

As shown in FIG. 2, between the base 5 and pressure plate 7, a support plate 8 is provided in parallel with the base 5. A circular hole 8A is made in the middle of the support plate 8. Inside the hole 8A, a temperature control mechanism whose diameter is a little smaller than that of the hole 8A is provided as a bottom jacket 9 on the base. As shown in FIGS. 1 and 2, a large number of junction terminals (e.g., pogo pins or bump terminals) 10 (e.g., 2000 to 3000 junction terminals) are arranged around the bottom jacket 9 in such a manner that they form concentric circles. These junction terminals 10 are provided in such a manner that they correspond to a large number of external terminals (hereinafter, referred to as connection pads) arranged around the electrode pads 3A of the contactor 3 so as to form concentric circles. When the contactor comes into contact with the wafer W, the junction terminals 10 electrically connect to the connection pads 3B.

The shell 4 transferred by the transfer mechanism (not shown) is received by the clamp mechanism in the temperature control compartment 1A. The cylinder mechanisms 6 force the pressure plate 7 to go down until the shell 4 has reached the bottom jacket 9. Specifically, the back of the wafer chuck 2 for the shell 4 comes into contact with the top surface of the bottom jacket 9 and the connection pads 3B of the contactor 3 electrically connect to the pogo pins 10. In this state, the bottom jacket 9 controls the temperature of the wafer chuck 2 to keep the temperature of the wafer W at a specific test temperature (e.g., 110° C.).

Figure 3A:
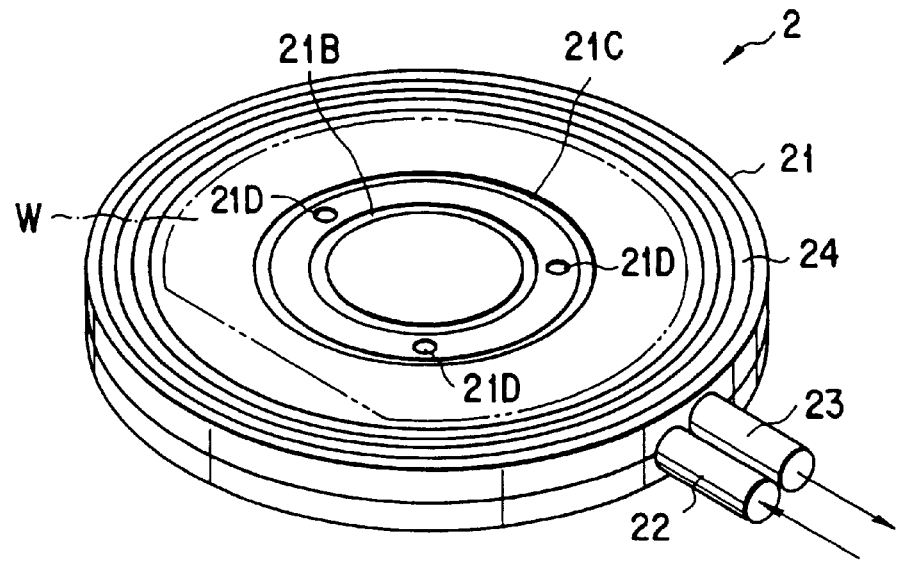
FIG. 3A is a perspective view of a wafer chuck.
Figure 3B:
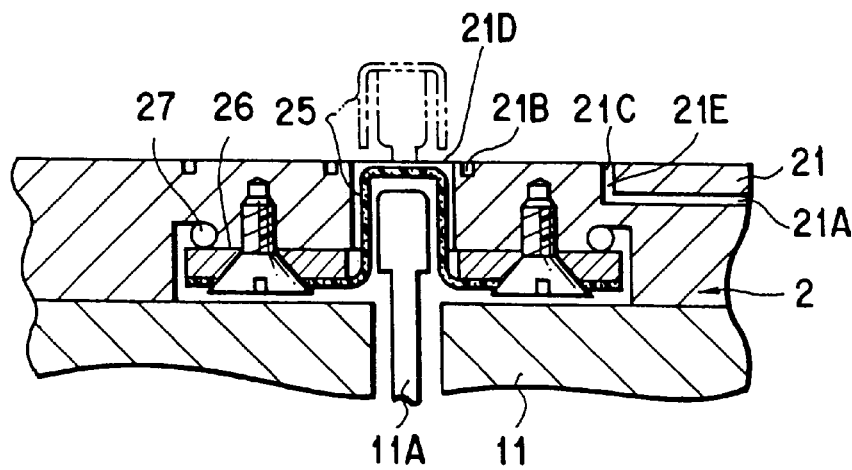
FIG. 3B is a sectional view of the important part of the wafer chuck.
Figure 3C:
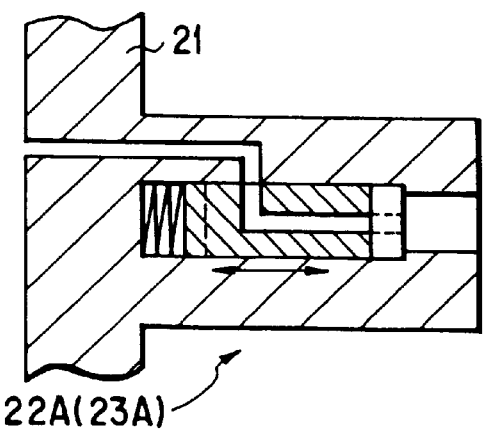
FIG. 3C is a sectional view of a valve mechanism for a gas supply and an exhaust pipe in the wafer chuck.

The wafer chuck 2 is provided with a disk-like chuck body 21 as shown in FIGS. 3A and 3B. The chuck body 21 has a structure that is integrated with the contactor 3, while the body 21 is holding the wafer W. In the chuck body 21, a gas flow path 21A is formed as shown in FIG. 3B. A gas supply pipe 22 is connected to the inlet (an opening in the peripheral surface of the body) of the gas flow path 21A. A gas exhaust pipe 23 is connected to the outlet (an opening adjacent to the inlet in the peripheral surface of the body) of the gas flow path 21A. A specific gas (chemically inactive gas, for example, nitrogen gas) is supplied and exhausted through the pipes 22, 23.

As shown in FIGS. 3A and 3B, ringed grooves 21B, 21C are made concentrically in the top surface of the chuck body 21. (In the figures, only two ringed grooves are shown). In these ringed grooves 21B, 21C, openings 21E leading to the gas flow path 21A are made in plural places. A seal ring 24 made of a flexible, elastic member, such as silicone rubber, is provided near the periphery of the top surface of the chuck body 21. When the wafer chuck 2 has been integrated with the contactor 3, the seal ring 24 hermetically seals the inside of the seal ring 24.

When the contactor 3 has been laid on top of the wafer chuck 2, the air between the contactor 3 and chuck 2 is exhausted through the gas exhaust pipe 23 and then a low-pressure inert gas is introduced through the gas supply pipe 22. In this state, the contactor 3 is integrated with the chuck 2 and will not separate from the latter. The pipes 22, 23 incorporate valve mechanisms 22A, 23A shown in FIG. 3C. Vacuumization is effected through the pipe 23 and nitrogen gas is supplied through the pipe 22. After the space between the wafer chuck 2 and contactor 3 has been depressurized, the gas pipe and vacuumization pipe (not shown either) are disconnected from the gas supply and exhaust pipes 22, 23, respectively. The spring force of the valve mechanisms 22A, 23A cause the valves to move from the position shown in the figure to the right, which shuts down the inlet and outlet, preventing air from flowing into the inside of the pipes, thereby maintaining the depressurized state between the wafer chuck 2 and contactor 3.

In the state where the wafer chuck 2 has been integrated with the contactor 3 as described above, all the electrode pads 3A of the contactor 3 are in contact with all the electrode pads P of all the chips on the wafer W held by the wafer chuck 2, which establishes an electrical connection between the pads 3A and pads P.

To cause the wafer W to make in-unison contact with the contactor 3, for example, a wafer-contactor position alignment unit that the applicant of this application has disclosed in Japanese Patent Application No. 10-054423 may be used. The electrode pads P on a wafer W are aligned with the electrode pads 3A on a contactor 3 and the former are caused to make in-unison contact with the latter. With the former and the latter in contact with each other, a wafer chuck 2, the wafer W, and the contactor 3 are integrated into an entity. The integrated structure of the three components is called a shell 4.

Before the process of integrating the wafer chuck 2, wafer W, and contactor 3 into an entity, the wafer W is placed on the wafer chuck 2 by means of three pins 11A of a main chuck 11 as shown in FIG. 3B.

Specifically, as shown in FIGS. 3A and 3B, three through holes 21D through which the three pins penetrate are made between the ringed grooves 21B and 21C in the wafer chuck 2. The inner diameter of the through holes 21D is larger than the outer diameter of the pins 11A. Inside each through hole 21D, a cylindrical silicone rubber film 25 whose tip is closed is placed. The base end of the silicone rubber film 25 is screwed via, for example, an aluminum packing 26 to a recessed section made in the back of the chuck body 21. An O-ring 27 is provided on the outer surface of the packing 26. The space between the wafer chuck 2 and contactor 3 is kept airtight by means of the silicone rubber film 25 and O-ring 27, thereby maintaining the depressurized state of the shell 4.

The tip of each of the three pins 11A is made slightly thick and rounded so as not to damage the silicone rubber film 25. Therefore, when the wafer W is placed on the wafer chuck 2 on the main chuck 11 or when the wafer W is removed from the wafer chuck 2, the three pins 11A of the main chuck 11 go up, penetrate through the through holes 21D in the wafer chuck 2, and project from the top surface of the chuck body 21 while expanding the silicone rubber film 25 as shown by single-dot-dash lines in FIG. 3B. During the action, too, the depressurized state between the wafer chuck 2 and contactor 3 is maintained.

Figure 4A:
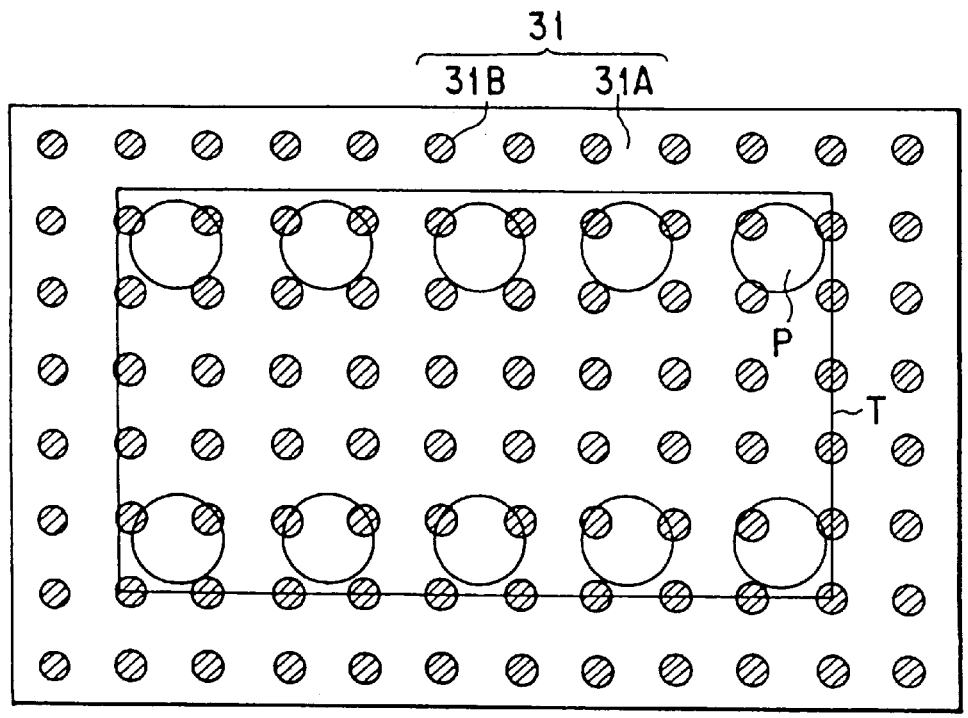
FIG. 4A is a plan view showing the relationship between an anisotropic conductive sheet of a contactor and chips in a state where the contactor have made in-unison contact with the wafer W.
Figure 4B:
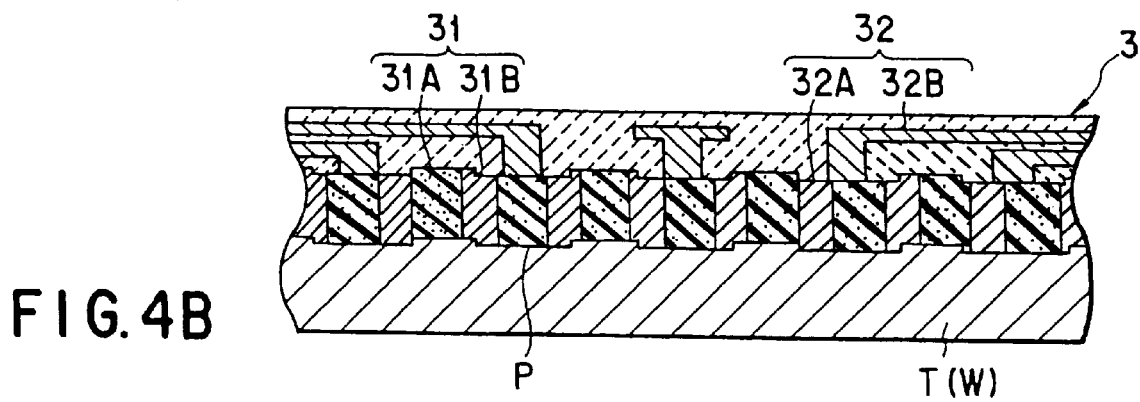
FIG. 4B is a sectional view of FIG. 4A.

The contactor 3 is composed of, for example, an anisotropic conductive sheet 31 and a wiring substrate 32 as shown in FIGS. 4A and 4B. In the anisotropic conductive sheet 31, conductors 31B are arranged in a matrix in a silicone rubber sheet 31A. The wiring substrate 32 includes electrode pads 32A that make reliable contact with the conductors 31B of the anisotropic conductive sheet 31, connection pads 3B (see FIG. 2) formed so as to correspond to the electrode pads 32A, and multilayer wires that connect these electrode pads 32A and 3B. The anisotropic conductive sheet 31 is formed integrally with the wiring substrate 32. In the state where the contactor 3 has been integrated with the wafer W, the conductors 31B of the anisotropic conductive sheet 31 electrically connect the electrode pads P of a chip T to the electrode pads 32A of the wiring substrate 32. The wiring substrate 32 is made of a material (e.g., such ceramic as silica glass) whose thermal coefficient is almost the same as that of the wafer W. The wires 32B are made of a material excellent in conductivity, such as aluminum. The conductors 31B have a structure where ultrafine metallic particles are distributed in the silicone rubber sheet 31A. When the contactor 3 has been pressed against the wafer W, the silicone rubber sheet 31A is compressed, making the ultrafine metallic particles come into contact with each other, which forms an electrically conducting path.

Figure 4C:
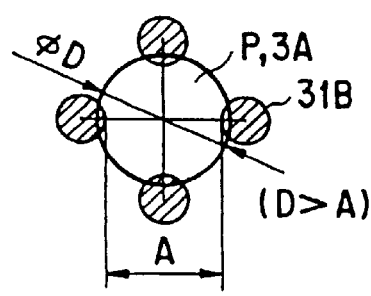
FIGS. 4C and 4D are plan views showing the relationship between each electrode pad and each conductor of an anisotropic conductive sheet.

To cause the electrode pads P of the chip T and the electrode pads 32A of the wiring substrate 32 to make reliable contact with the conductors 31B of the anisotropic conductive sheet 31, the conductors 31B are arranged so as to meet the conditions described in the following items (1) and (2):

(1) The distance A between adjacent conductors 31B is smaller than the diameter D of the electrode pad P and that of the electrode pad 32A as shown in FIG. 4C.

Figure 4D:
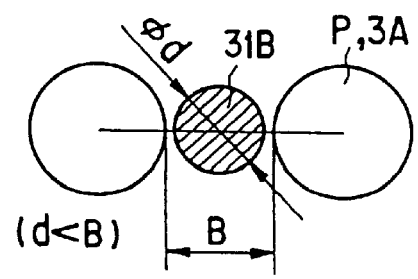

(2) The distance B between adjacent electrode pads P, 32A is larger than the diameter d of the conductor 31B as shown in FIG. 4D.

Figure 5:
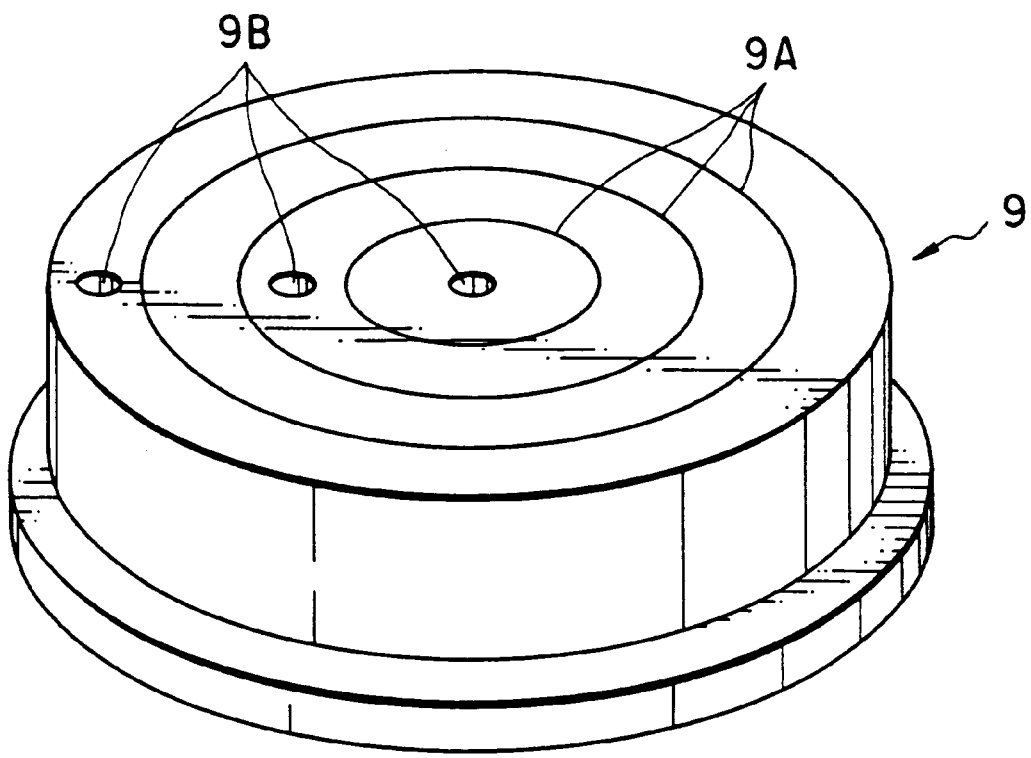
FIG. 5 is a perspective view of the bottom jacket of FIG. 2.

The bottom jacket 9 controls the temperature of the shell 4. As shown in FIG. 5, like the wafer chuck 2, the bottom jacket 9 includes ringed grooves 9A made concentrically in its surface, an internal exhaust passage (not shown), holes (not shown) connecting the ringed grooves 9A to the exhaust passage, and through holes 9B. With the shell 4 on the bottom jacket 9, the ringed grooves 9A are vacuumized via the exhaust passage by a vacuumization unit (not shown), which causes the shell 4 to adhere to the bottom jacket 9 by vacuumization.

Figure 6:
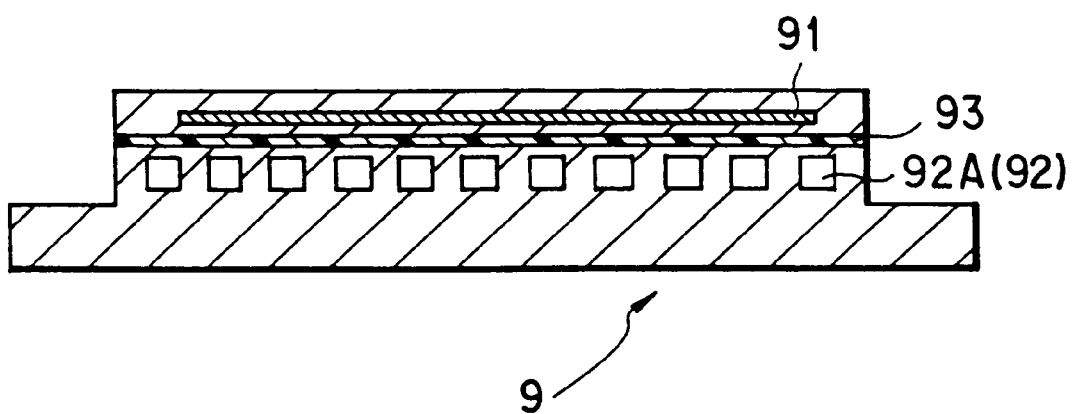
FIG. 6 is a sectional view of the bottom jacket of FIG. 5.

Inside the bottom jacket 9, a plane heater 91 and a first cooling jacket 92 are provided as shown in FIG. 6. The shell 4 on the bottom jacket 9 is controlled by the plane heater 91 and first cooling jacket 92 to a specific test temperature. The plane heater 91 is placed at the top surface of the bottom jacket 9. The first cooling jacket 92 is located below the plane heater 91. Preferably, a thermal resistance sheet 93 excellent in heat insulation, such as tetrafluoroethylen resin, is provided between the plane heater 91 and first cooling jacket 92. The heat resistance sheet 93 thermally isolates the first cooling jacket 92 from the plane heater 91. Use of the heat resistance sheet 93 not only prevents the first cooling jacket 92 from being overheated but also enables the temperature of the shell 4 to be kept at the optimal test temperature. Specifically, inside the first cooling jacket 92, refrigerant flow paths 92A are formed all over the cross section of the bottom jacket as shown in FIG. 6. A refrigerant (in this embodiment, cooling water) flows through the refrigerant flow paths 92A. If the cooling water were heated by the plane heater 91 and boiled in the cooling jacket 92, the cooling water might not function as a refrigerant. To avoid this, the heat from the plane heater 91 is shut off by the heat resistance sheet 93, thereby keeping the cooling water at 70 to 80° C., which constantly assures the optimal cooling performance. As described above, controlling the plane heater 91 and first cooling jacket 92 to the optimal temperature enables the shell 4 to be kept constantly at the optimal test temperature (e.g., 110° C.).

Figure 7:
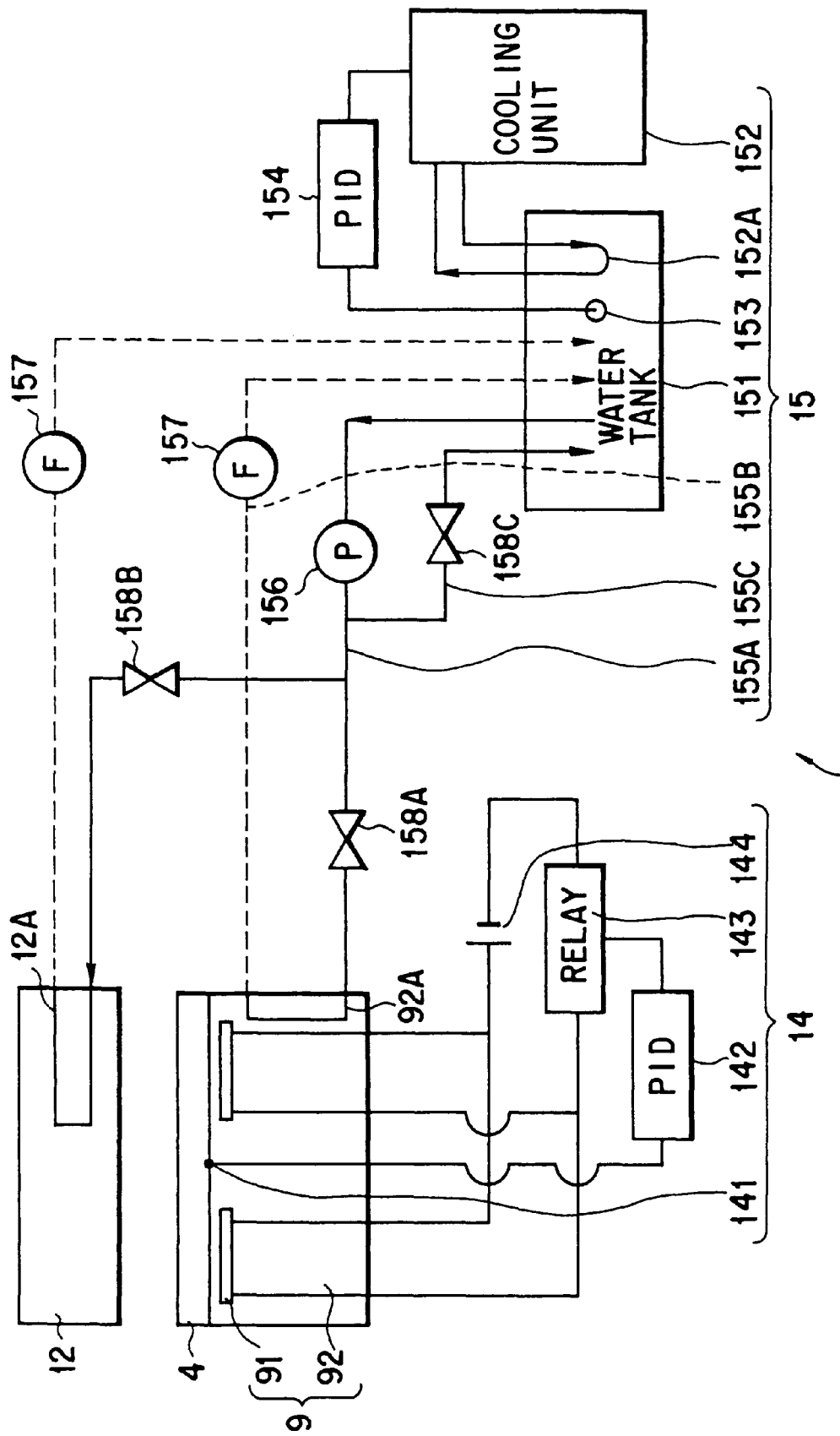
FIG. 7 is a block diagram of the temperature control unit in the wafer storage chamber of FIG. 1.

The first cooling jacket 92 not only controls the temperature of the bottom jacket 9 but also suppresses the rise of the temperature around the first cooling jacket 92. As shown in FIG. 7, a second cooling jacket (hereinafter, referred to as a top jacket) 12 is provided on the back of the pressure plate 7. A cooling water flowing through the refrigerant flow paths 12A inside the top jacket 12 not only cools the contactor 3 held by the pressure plate 7 but also suppresses the rise of the temperature around the contactor.

Consequently, in the temperature control compartment 1A, the bottom jacket 9 controls the temperature of the wafer chuck 2 and the first cooling jacket 92 and top cooling jacket 12 suppresses the rise of the temperature around the wafer chuck, which suppresses the radiation of heat from the temperature control compartment 1A as much as possible.

The plane heater 91, first cooling jacket 92, and top jacket 12 operate under the control of the wafer temperature control unit 13. The wafer temperature control unit 13 will be described by reference to FIG. 7. As shown in FIG. 7, the wafer temperature control unit 13 is composed of a heater temperature control unit 14 for controlling the temperature of the plane heater 91 and a refrigerant temperature control unit 15 for controlling the temperature of a cooling water supplied to the first cooling jacket 92 and top jacket 12.

As shown in FIG. 7, the heater temperature control unit 14 comprises a temperature measuring unit 141 for measuring the temperature of the wafer chuck 2, a first PID adjuster for transmitting a PID control signal on the basis of the deviation of the sense signal from the temperature measuring unit 141 from a preset target value (e.g., 110° C.), a relay 143 that operates on the basis of the PID control signal from the first PID adjuster 142, and a heater power supply 144 for controlling the temperature of the plane heater 92 on the basis of the operation of the relay 143. According to the deviation of the sense signal from the temperature sensor 141 from the target value, the temperature of the wafer chuck 2 rises to the target value quickly and is kept at the test temperature stably. When the measured temperature of the wafer chuck 2 has deviated from the target value (110° C.), the first PID adjuster 142 transmits a PID control signal to the relay 143 according to the amount of deviation. The relay 143 provides PID control of the heater power supply 144, which causes the temperature of the plane heater 92 to coincide with the target value quickly and stably.

As shown in FIG. 7, the refrigerant temperature controlling unit 15 comprises a water tank 151 for storing a cooling water for the first cooling jacket 92 and top jacket 12, a cooling unit 152 with a refrigerant pipe 152A immersed in the cooling water of the water tank 151, a temperature sensor 153 for measuring the temperature of the water in the water tank 151, and a second PID adjuster 154 for providing PID control of the cooling unit 152 according to the deviation of the sense signal from the temperature sensor 153 from a preset target value. The cooling water is cooled down quickly to the target value according to the deviation of the sense signal from the temperature sensor 153 from the preset target value, and is kept at a stable temperature.

A supply pipe 155A (indicated by solid lines in FIG. 5) and a return pipe 155B (indicated by broken lines in FIG. 5) connect the water tank 151 to the inlets and outlets of the refrigerant flow paths 92A and 12A of the first refrigerant jacket 92 and top jacket 12. The pipes 155A, 155B enable the cooling water to circulate through the water tank 151, the first cooling jacket 92, and top jacket 12. The pipe 155A is separated in the middle in such a manner that one is connected to the inlet of the refrigerant flow path 92A of the first cooling jacket 92 and the other is connected to the inlet of the refrigerant flow path 12A of the top jacket 12. A pump 156 is provided on the water tank 151 side of the junction point of the pipe 155A. The pump 156 circulates the cooling water. The flow rate of the cooling water in the supply path and return path is measured by a flowmeter 157. When the temperature of the cooling water in the water tank 151 has deviated from the target value (e.g., 40° C.), the second PID adjuster 154 transmits a PID control signal to the cooling unit 152 according to the amount of deviation. The cooling unit 152 is subjected to PID control, adjusting the flow rate of the refrigerant in the refrigerant pipe 152A, which causes the temperature of the cooling water in the water tank 151 to coincide with the target value quickly and stably. In this way, the refrigerant temperature control unit 15 provides optimal control of the temperature of the cooling water, enabling the first cooling jacket 92 to cool not only the bottom jacket 9 but also its vicinity. The top jacket 12 cools not only the contactor 3 but also its vicinity, which suppresses the rise of the temperature in the temperature control compartment 1A.

For example, ethylene glycol or water is used as the refrigerant for the cooling unit 152. In FIG. 7, reference symbol 155C indicates a return pipe and 158A, 158B, 158C indicate valves. When the cooling water is not supplied to the first cooling jacket 92 or top jacket 12, the valves 158A, 158B are closed and the valve 158C is opened, which allows the cooling water to return to the water tank 151.

With the present invention, special improvements have been made on the temperature measuring unit 141 of the wafer chuck 2 to enable the wafer chuck 2 to measure the temperature of the wafer W accurately. The accurate measurement increases the control accuracy of the wafer temperature control unit 13, which increases the reliability of the reliability test for the wafer W.

An embodiment of the temperature measuring unit of the wafer chuck according to the present invention will be described by reference to FIGS. 8A and 8B.

Figure 8A:
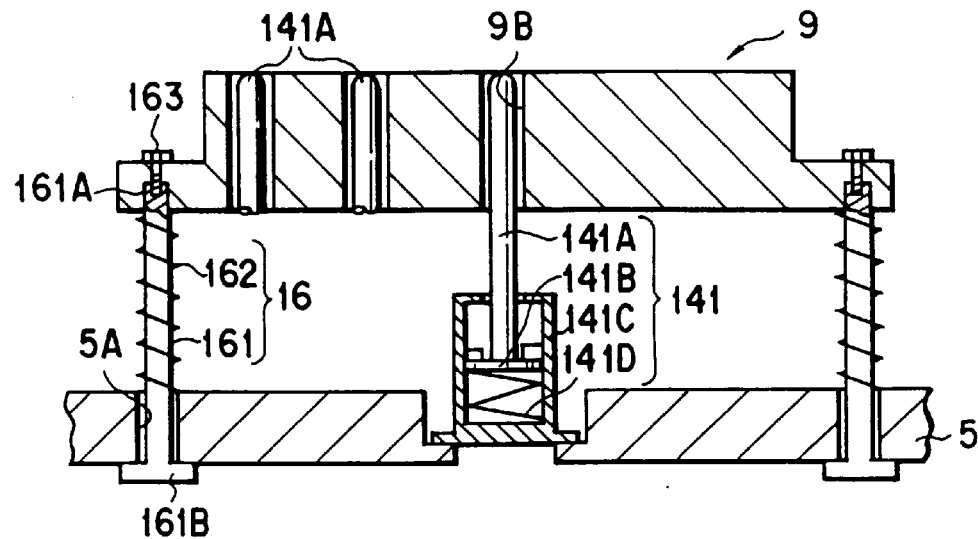
FIG. 8A is a sectional view of the jacket junction unit and wafer temperature measuring unit with a shell unmounted in the bottom jacket of FIG. 2.
Figure 8B:
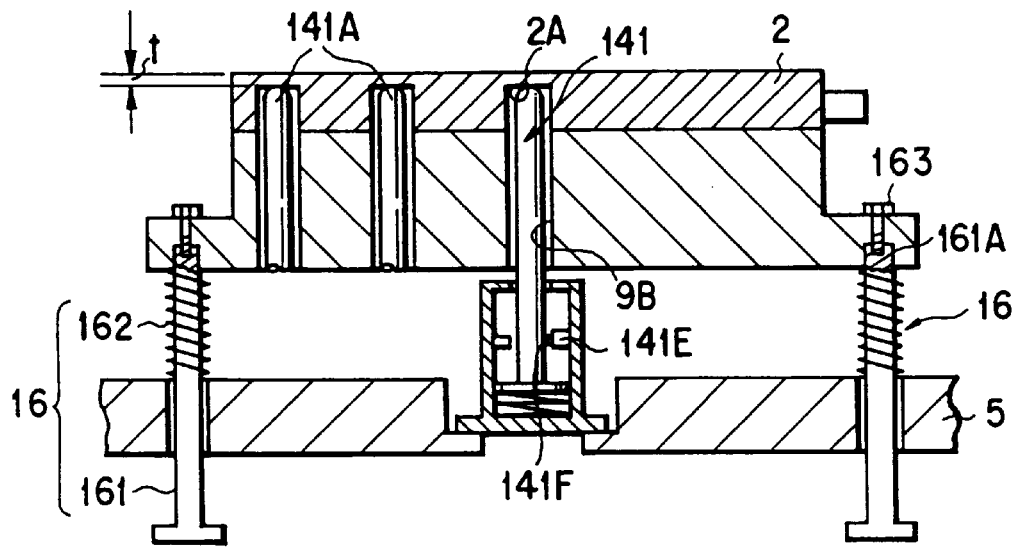
FIG. 8B is a sectional view of the jacket junction unit and wafer temperature measuring unit with a shell mounted in the bottom jacket of FIG. 2.

As shown in FIGS. 8A and 8B, the temperature measuring unit 141 of the present embodiment comprises a rod-like temperature sensor 141A for sensing the temperature of a wafer chuck 2, a cylinder 141C for housing a flange-like piston section 141B formed at the base of the temperature sensor 141A, and a spring 141D which is loaded in the cylinder 141C and constantly urges the temperature sensor 141A upward. The temperature measuring units 141 are provided in three places on a base 5 in such a manner that they are set up straight. As shown in FIG. 5 and FIGS. 8A and 8B, the three temperature sensors 141A are inserted in three through holes 9B spaced radially from the center of the bottom jacket 9 to the vicinity of the outer periphery.

The temperature sensor 141A has a structure where, for example, a thermocouple (or a temperature-measuring resistive element) is inserted in a stainless pipe with a closed tip. FIGS. 8A and 8B show all of the temperature measuring unit 141 located in the center of the wafer chuck 2. Regarding the remaining structure of the temperature measuring unit 141, only the tip portion of the temperature sensor 141A is shown.

In the back of the wafer chuck 2, three recessed sections 2A corresponding to the through holes 9B are formed in the radial direction direction of radius. Each recessed portion 2A has a depth that extends from the back of the wafer chuck 2 to the vicinity of its surface. During a test, the temperature sensors 141A make elastic contact with the deepest portions of the recessed sections 2A and measure the temperature of the wafer chuck 2 at a position as close to the wafer W as possible.

This enables the temperature of the wafer W to be measured very accurately. The thickness t from the deepest portion of the recessed section 2A to the surface of the wafer chuck is set at, for example, 1 mm.

The wafer chuck 2 is made of a metallic material excellent in thermal conductivity, such as aluminum, which minimizes the temperature gradient from the wafer surface of the wafer chuck 2 to the deepest portion 2A.

When the shell 4 is pressed against the bottom jacket 9 by the pressure plate 7, this causes the shell 4 to adhere to the bottom jacket 9 and then the shell 4 and bottom jacket 9 go down. Each of the tips of the three temperature sensors 141A protrudes from the surface of the bottom jacket 9 and goes into the recessed section 2A of the wafer chuck 2. When the shell 4 and bottom jacket 9 further go down, each of the tips of the temperature sensors 141A adheres elastically to the deepest portion of the recessed section 2A by means of the spring 141D. The temperature of the wafer chuck 2 is measured in the position closest to the wafer W of the wafer chuck 2. Therefore, the temperature closest to the actual temperature of the wafer W is measured. The temperature sensors 141A are moved up and down by the spring 141D in the range of, for example, 15 mm.

Figure 8C:
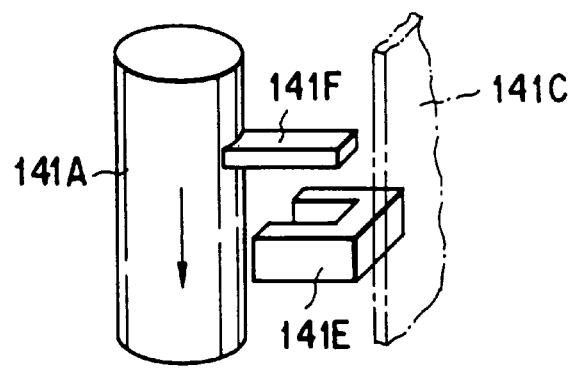
FIG. 8C is an enlarged view showing the relationship between a temperature sensor and a position sensor in the bottom jacket of FIG. 2.

As shown in FIG. 8C, on the inner surface of the cylinder 141C, a position sensor 141E is provided. The position sensor 141E has a square-U-shaped flat structure. When the temperature sensor 141A goes down in the direction of arrow, overcoming the force of the spring 141D, a shutter 141F provided on the temperature sensor 141A shuts off the light from the position sensor 141E, which enables the position sensor 141E to sense the height of the temperature sensor 141A. The position sensor 141E senses the height of the temperature sensor 141A, thereby sensing whether the shell 4 has been placed on the bottom jacket 9.

As shown in FIGS. 8A and 8B, a jacket junction unit 16 is provided on the bottom jacket 9 and joins the shell 4 securely to the bottom jacket 9. As shown in 8A, the jacket junction unit 16 includes long bolts 161 and springs 162 surrounding the long bolts 161 and elastically supporting the bottom jacket 9. The long bolts 161 couple the base 5 with the bottom jacket 9 and support them.

More specifically, through holes 5A corresponding to the long bolts 161 are made in the base 5 as guide holes at regular intervals along the circumference. The bolts 161 penetrate through the through holes 5A and the heads 161B of the long bolts 161 are screwed to the back of the base 5.

In the outer periphery of the back of the bottom jacket 9, recessed sections in which the long bolts 161 are inserted are formed at regular intervals along the circumference. In the center of each recessed section, a through hole is made. At the tip of each long bolt 161, a female thread section 161A is formed. The tip is fitted in the recessed section of the bottom jacket 9. The screw 163 inserted from the surface of the bottom jacket 9 into the through hole is screwed to the female thread section 161A. Therefore, the long bolt 161 goes straight down from the bottom jacket 9 and its head stops at the back of the base 5.

As described earlier, when the pressure plate 7 has caused the shell 4 to go down and the shell has reached the bottom jacket 9, the position of the surface of the bottom jacket 9 is corrected by the shell 4 as a result of a gradual compression of each spring 162 caused by the descent of the shell 4, even if the shell 4 inclines slightly with respect to the surface of the bottom jacket 9.

The correction enables the shell 4 to adhere elastically to the entire surface of the bottom jacket 9. As a result, the shell 4 is level and all the electrode pads 3A of the contactor 3 make in-unison contact with the pogo pins 10 uniformly. The expansion and contraction range of the screw 162 is set so that the bottom jacket 9 may move up and down in the range of, for example, 10 mm, when the shell 4 is joined to the bottom jacket 9. In order that the spring 141D of the temperature measuring unit 14 may expand and contract in the range of 15 mm when the shell 4 joins to the bottom jacket 9, the expansion and contraction range of the spring 141D has an allowance of 5 mm for the spring 162. Therefore, when the shell 4 joins to the bottom jacket 9, if the bottom jacket 9 goes down 10 mm, the temperature sensor 141A is constantly in elastic contact with the recessed section 2A of the wafer chuck 2.

Figure 9A:
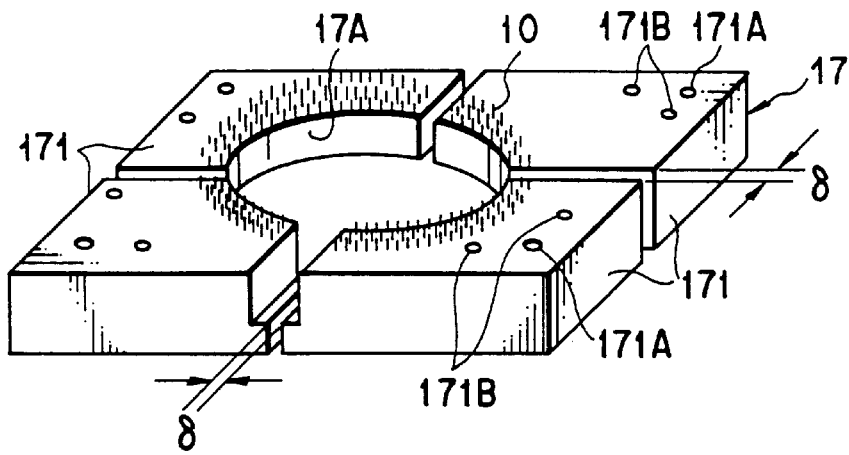
FIG. 9A is a perspective view of a pogo pin block on which pogo pins are set up straight.
Figure 9B:
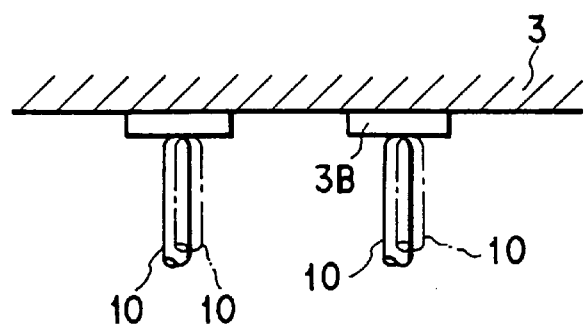
FIG. 9B pictorially shows the effect of heat when the pogo pins are in contact with the conductors.
Figure 10A:
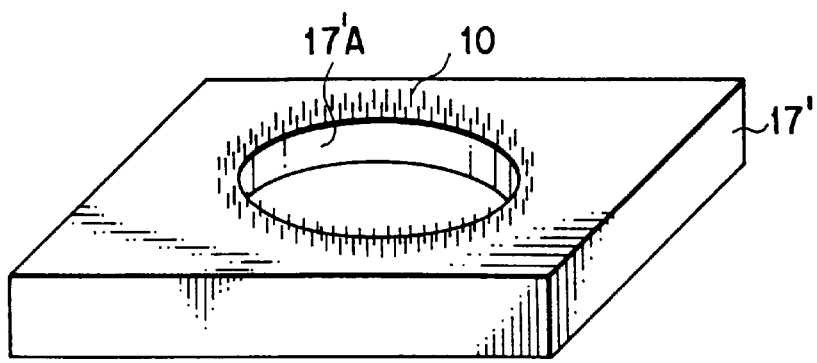
FIG. 10A shows another pogo pin block on which pogo pins are set up straight, in comparison with the pogo pin block shown in FIG. 9.
Figure 10B:
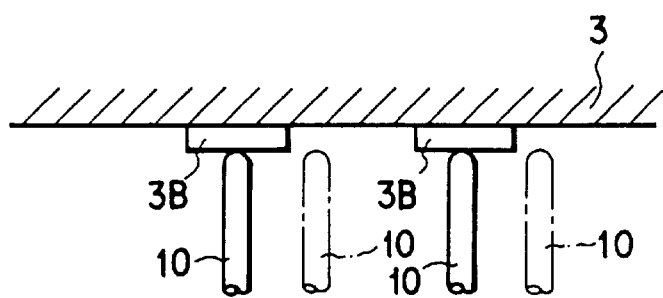
FIG. 10B pictorially shows the effect of heat when the pogo pins are in contact with the conductor in FIG. 10A.

As shown in FIG. 9A, a pogo pin block 17 is provided on a support plate 8 (FIG. 2) surrounding the bottom jacket 9. Pogo pins 10 are provided on the pogo pin block 17. As shown in FIG. 9A, the pogo pin block 17 has a structure where the bottom jacket 9 is divided (in this case, quadrisected) radially at the center of a hole 17A the bottom jacket 9 faces. Each part of the structure is formed into a block element 171. A clearance δ of 1 mm is given between adjacent block elements 171. Each clearance δ absorbs the thermal expansion of each block element 171. Such a structure of the pogo pin block 17 decreases changes in the dimensions due to the thermal expansion of the pogo pin block 17. As shown in FIG. 9B, even when the block element 171 expands thermally, the pogo pins will move, for example, only from the solid line position to the dot-dash line position, enabling the pogo pins to come into contact with the connection pads 3B of the contactor 3 reliably without coming off the pads 3B. If a pogo pin block 17' is formed into a single block as shown in FIG. 10A, changes in the dimensions of the pogo pin block 17' due to thermal expansion will be large, because the pogo pin block 17' is four times as large as the block element 171. As shown in FIG. 10B, the pogo pins 10 will move from the solid line position to the dot-dash line position and possibly come off the connection pads 3B of the contactor 3, leading to a decrease in the reliability of the test. For example, the pogo pin block 17 shown in FIG. 9A measured 310 mm long, 310 mm wide, and 30 mm thick, the amount of shift of an outer pogo pin 10 was 300 μm (see FIG. 9B). In the case of the pogo pin block 17' of FIG. 10A, however, the amount of shift of a similar pin was 600 μm, even when the block 17' was as large as the block 17 of the FIG. 9A.

Therefore, when the pogo pin block 17 is quadrisected and a clearance of δ is given, the amount of shift of the pogo pins 10 is halved, enabling the pogo pins 10 to make into contact with the connection pads 3B of the contactor 3 reliably and stably, which increases the reliability of test. It is desirable that the pogo pin block 17 should be made of synthetic resin, such as glass-fiber-filled polyimide or polyamide-imide resin, formed into a rectangle, and have a thermal coefficient as large as that of the contactor 3.

In the corners of the block element 171, guide holes 171A are made. On the basis of the guide holes 171A and the guide holes (not shown) made corresponding to the guide holes 171A in the base 5, the block element 171 is located in a specific mounting position. Furthermore, fastening holes 171B for fastening members, such as screws, are made in the block elements 171. On the basis of the fastening holes 171B and the fastening holes made in the base 5 corresponding to the fastening holes 171B, the block element 171 is secured in a specific mounting position. After guide pins (not shown) have been inserted into the guide holes 171A of the block elements 171 and base 5, the block elements 171 are secured to the base 5 by the fastening members. With this structure, the block elements 171 are fixed securely in the specific mounting positions. It is desirable that the fastening holes in the block elements 171 may have an allowance to absorb changes in the dimensions due to the thermal expansion of the block elements 171.

The operation of the apparatus will be explained. As shown in FIG. 1, before the shell 4 is put in the wafer storage chamber 1, the alignment unit aligns the wafer chuck 2, wafer W, and contactor 3 and integrates them into a shell 4. To do this, the wafer chuck 2 is placed on the main chuck 11 of the alignment unit as shown in FIG. 3B. After the wafer chuck 2 has been placed on the main chuck 11, the wafer W is transferred onto the wafer chuck 2. At this time, the three pins 11A of the main chuck 11 go up, penetrate through the through holes 21D of the wafer chuck 2, protrude from the surface of the wafer chuck 2 while expanding the silicone rubber film 25, and wait to receive the wafer W. Thereafter, when the wafer chuck 2 has received the wafer W, the three pins 11A retract into the main chuck 11 and return to the original position and the wafer W is placed on the wafer chuck 2. In parallel with this action, the contactor 3 is located in a specific position above the main chuck 11. Then, the electrode pads P of the wafer W and the electrode pads 3A of the contactor 3 are read by an imaging element, such as a CCD camera (not shown), finding the coordinates of the positions of representative ones of the electrode pads P of the wafer W. The coordinates of the positions of the electrode pads 3A of the contactor 3 corresponding to the electrode pads P are also found. On the basis of the coordinates of the positions, the main chuck 11 moves in the directions of X, Y, θ and aligns the electrode pads P with the electrode pads 3A. After the alignment, the main chuck 2 goes up, causing all the electrode pads P to make in-unison contact with the electrode pads 3A corresponding to the pads P.

At this time, the wafer chuck 2 is ready for nitrogen gas replacement and vacuumization through the gas supply and exhaust pipes 22, 23. The air between the wafer chuck 2 and contactor 3 is replaced with nitrogen by supplying nitrogen gas through the gas supply pipe 22.

Then, the nitrogen gas supply source is disconnected from the gas supply pipe 22. The valve mechanisms 22A, 23A operate to close the gas flow path 21A. On the other hand, the nitrogen gas between the wafer chuck 2 and contactor 3 is exhausted via the gas exhaust pipe 23, the gas flow path 21A, and the ringed grooves 21B, 21C in the surface of the wafer chuck 2.

As shown in FIG. 4, the electrode pads P of the wafer W make in-unison contact with the electrode pads of the contactor 3. As a result, the shell 4 enables all the chips to be tested in unison in the wafer state. Even when the height of the electrode pads P varies, the anisotropic conductive sheet 31 is capable of absorbing the variations. The space between the wafer chuck 2 and contactor 3 is shut off from the outside world by the seal ring 21 provided around the wafer chuck 2 and the through holes 21D for three pins are shut off from the outside world by the silicone rubber film 25. This enables the depressurized state to be maintained reliably when the space between the wafer chuck 2 and contactor 3 has been depressurized.

Thereafter, the transfer mechanism (not shown) transfers the shell 4 from the alignment unit to the wafer storage chamber 1 as shown in FIG. 1. In the wafer storage chamber 1, the clamp mechanism clamps the shell 4. The four cylinder mechanisms 6 are actuated, causing the pressure plate 7 to press the shell 4 down to the bottom jacket 9. Even if the shell 4 inclines slightly with respect to the bottom jacket 9 when the shell 4 has reached the bottom jacket 9 as a result of the descent of the pressure plate 7, the inclination will be absorbed by the springs 162 of the jacket junction unit 16, allowing the shell 4 to adhere elastically to the bottom jacket 9. When the pressure plate 7 has reached the descent end, not only the wafer chuck 2 for the shell 4 adheres to the bottom jacket 9 uniformly, but also all the connection pads 3B of the contactor 3 of the shell 4 electrically contact the corresponding pogo pins 10. This brings all the chips on the wafer W into a state where they can be tested in unison in the wafer state.

The following is an explanation of how the wafer chuck 2 is joined to the bottom jacket 9. When the wafer chuck 2 has come into contact with the bottom jacket 9 and the bottom jacket 9 has descended, overcoming the force of the springs 162 of the jacket junction unit 16, the temperature sensors 141A of the temperature measuring unit 141 protrude from the surface of the bottom jacket 9 gradually, and fit into the recessed sections 2A of the wafer chuck 2. Before the bottom jacket 9 reaches the descent end, the temperature sensors 141A touch the deepest portions of the recessed sections 2A. Furthermore, the springs 141D cause the tips of the temperature sensors 141A to elastically contact the deepest portions of the recessed sections 2A. This brings the sensors into a state where they can measure the temperature of the wafer chuck 2 in a position only 1 mm away from the wafer W.

The sensing of the positions of the temperature sensors 141A by the position sensors 141E makes it possible to reliably sense whether the shell 4 exists on the bottom jacket 9.

When the test is started, the wafer temperature control device 13 heats the wafer W to the test temperature (110° C.) and keeps it at that temperature. At this time, the heater temperature control unit 14 turns on the heater power supply 144 to cause the plane heater 91 to heat the wafer chuck 2 from below. The temperature sensors 141A of the temperature measuring unit 141 measure the temperature of the wafer chuck 2 and transmit the sense signals to the PID adjuster 142. The PID adjuster 142 transmits to the relay 143 a control signal corresponding to the deviation of the measured temperature from the target value (test temperature). The relay 143 subjects the heater power supply 144 to PID control. The heater power supply 144 applies the power corresponding to the deviation to the plane heater 91. The plane heater 91 raises the temperature of the wafer chuck 2 to the test temperature in a short time. On the other hand, in the refrigerant temperature control unit 15, the valves 158A, 158B are opened, the pump 156 is driven, and the cooling water in the water tank 151 is supplied through the supply pipe 155A to the first cooling jacket 92 of the bottom jacket 9 and top jacket 12. The cooling water passes through the refrigerant flow paths 92A, 12A and the return pipe 155B and returns to the water tank 151, thereby cooling the bottom jacket 9 and top jacket 12.

When the temperature of the wafer chuck 2 has reached the test temperature, the PID adjuster 142 operates on the basis of the sense signal from the temperature sensors 141A, subjecting the heater power supply 144 to PID control. The PID control enables the power supplied to the heater power supply 144 to be kept at an almost constant level, maintaining the wafer chuck 2 at the test temperature. In the meantime, while the bottom jacket 9 and top jacket 12 are cooled by the cooling water, the cooling water absorbs the heat from the plane heater 91 and rises in temperature. However, because the heat resistance sheet 93 intervenes between the plane heater 91 and first cooling jacket 92, most of the heat flow from the plane heater 91 to the first cooling jacket 92 is cut off by the heat resistance sheet 93, preventing the temperature of the cooling water from rising excessively. As a result, the cooling water is prevented from boiling in the refrigerant flow path 92A, enabling the bottom jacket 9 to be cooled efficiently.

When the temperature of the wafer chuck 2 has reached the test temperature, the temperature of the cooling water returning from the bottom jacket 9 and top jacket 12 to the water tank 151 has reached about 70 to 80° C. Thus, the cooling water in the water tank 151 is cooled by the cooling unit 152 to a temperature (e.g., 40° C.) at which the cooling efficiency is always good. The temperature of the cooling water is constantly sensed by the temperature sensor 153, which transmits the sense signal to the PID adjuster 154. The cooling unit 152 is subjected to PID control, constantly adjusting the flow rate of the refrigerant, which constantly keeps the cooling water in the water tank 151 at a constant temperature. As a result, not only the first cooling jacket 92 suppresses the rise of the temperature around the bottom jacket 9, but also the top jacket 12 suppresses the temperature rise of the contactor 3 and the rise of the temperature around the contactor 3. The temperature rise in the temperature control compartment 1A is suppressed, which suppresses the heat dissipation toward the outside of the wafer storage chamber 1.

As a result of the rise of the temperature in the temperature control compartment 1A, the pogo pin block 17 expands thermally. Changes in the dimensions due to the thermal expansion of the pogo pin block 17 are remarkably small, because the pogo pin block 17 has been divided into four block elements 171, with a 1-mm clearance between the block elements 171. Accordingly, the pogo pins 10 provided on the pogo pin block 17 come into contact with the connection pads 3B of the contactor 3 stably and reliably.

When the temperature of the wafer W has reached the test temperature under the control of the wafer temperature control unit 13, a test signal S1 is transmitted via the connector, pogo pins 10, and contactor 3 to the wafer W as shown in FIG. 2. A sense result signal S2 from the wafer W is transmitted to the tester in the opposite route. In this way, all the chips are tested in the wafer state.

As explained above, with the embodiment, the wafer chuck 2 that holds the wafer W making in-unison contact with the contactor 3 is placed on the bottom jacket 9. The bottom jacket 9 raises the temperature of the wafer W to a specific test temperature (110° C.). Three recessed sections 2A are made in the back of the wafer chuck 2 in such a manner that their depth reaches close to the surface of the chuck 2. Through holes 9B corresponding to the recessed sections 2A are made in the bottom jacket 9. The temperature sensors 141A capable of being inserted into the through holes 9B as far as the recessed sections 2A are provided on the base 5 below the bottom jacket 9.

The temperature sensors 141A are supported by the springs 141D. During a test, the tips of the temperature sensors 141A are caused to make elastic contact with the recessed sections 2A. This enables the temperature sensors 141A to be located near the wafer W during the test in the wafer storage chamber 1, making it possible to measure the temperature of the wafer chuck 2 and consequently the temperature of the wafer W accurately, which increases the accuracy of the test.

With the embodiment, the position sensor 141E is provided which senses whether the wafer chuck 2 (the shell 4 in the embodiment) exists on the bottom jacket 9. The position sensor 141E makes it possible to reliably sense whether the shell 4 has been mounted on the bottom jacket 9 and measure the temperature of the wafer W without error.

While in the embodiment, a temperature control mechanism has been installed as the bottom jacket 9 on the base 5 in the wafer storage chamber 1, the temperature control mechanism may be provided as a top jacket on the top surface of the wafer storage chamber 1.

Although in the embodiment, the wafer storage chamber 1 has been arranged horizontally, it may be arranged vertically. In this case, depending on the relative positional relationship between the temperature control mechanism in the wafer storage chamber 1 and the wafer hold table, the temperature sensors of the temperature measuring unit are able to make elastic contact with the wafer hold table from above or from one side.

With the embodiment, the wafer chuck 2 holding the wafer making in-unison contact with the contactor 3 is caused to descend toward the bottom jacket 9. The jacket junction unit 16 joining the chuck 2 to the bottom jacket 9 includes long bolts 161 extending in the direction in which the bottom jacket 9 moves up and down and springs 162 arranged around the long bolts 161 and elastically supporting the bottom jacket 9.

The jacket junction unit 16 presses the entire wafer chuck 2 against the entire bottom jacket 9 uniformly and elastically when the chuck 2 is joined to the jacket 9. As a result, the heat transfer rate between the chuck 2 and the bottom jacket 9 is increased, making it possible not only to heat the wafer W swiftly during the test but also keep the wafer at the test temperature accurately, which increases the reliability of the test.

While in the embodiment, the springs 162 have been used as elastic members in the jacket junction unit 16, parts other than springs may be used as the elastic members.

The elastic members may be provided in a place different from the long bolts 161.

While the temperature control mechanism provided as the bottom jacket 9 on the base 5 in the wafer storage chamber 1 has been explained, the temperature control mechanism may be provided as a top jacket on the ceiling of the wafer storage chamber 1.

Because the heater control unit 14 and refrigerant temperature control unit 15 include the PID adjusters 142, 154 respectively, the cooling water in the wafer chuck 2 and water tank 151 is set at the target temperature quickly on the basis of the sense signals from the temperature sensors 141, 153. This enables the temperature of the cooling water to be kept at the target temperature stably.

The temperature sensors 141A penetrate through the bottom jacket 9 and make elastic contact with the recessed sections 2A of the wafer chuck 2, which enables the temperature of the wafer W to be measured accurately.

Because the bottom jacket 9 is cooled by the cooling water, the wafer W is cooled stably at low cost.

While in the embodiment, the mechanism using the PID adjusters 142, 154 as means for controlling the temperature of the cooling water in the wafer tank 151 and that of the wafer chuck 2 has been explained, other suitable conventional control means may be used.

While in the embodiment, the mechanism using the cooling water as the refrigerant in the bottom jacket 9 and top jacket 12 has been explained, conventional refrigerants other than cooling water may be used.

With the embodiment, the wafer chuck 2 comprises the body 21 holding the wafer W, the openings in the surface of the body 21, the gas flow path 21A formed in the body 21 and connected to the openings, the valve mechanisms 22A, 23A provided to the inlet and outlet of the gas flow path 21A, and the seal ring 24 provided on all of the periphery of the surface of the body 21. The through holes 21D are made in the body 21. The through holes 21D enable the three pins 11A of the main chuck 11 to move up and down when the wafer W is placed on or removed from the surface of the body 21. Because each of the through holes 21D is provided with the silicone rubber film 25 that expands and contracts as the three pins 11A move up and down, the three pins 11A of the main chuck 11 go into and out of the through holes 21D when the wafer W is placed on and removed from the wafer chuck 2. In this way, the three pins 11A enable the wafer W to be placed on and removed from the chuck smoothly.

To cause the contactor 3 to make in-unison contact with the main chuck 2, the space between the body 21 of the main chuck 2 and the contactor is vacuumized via the gas supply pipe 22 and exhaust pipe 23. The vacuum state is maintained because the space between the body 21 of the main chuck 2 and the contactor 3 is sealed by the seal ring 24 and silicone rubber film 25 and the gas supply pipe 22 and gas exhaust pipe 23 are closed by the valve mechanisms 22A, 23A.

Figure 3D:
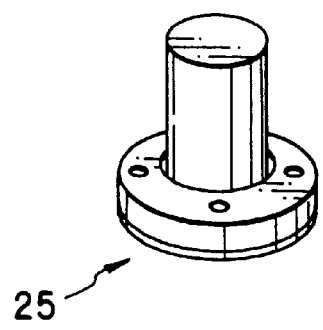
FIG. 3D is a perspective view of a seal member used for the wafer chuck.

After the wafer chuck 2, wafer W, and contactor 3 have been integrated into an entity as the shell 4, the transfer mechanism transfers the shell 4 easily to the wafer storage chamber 1. As shown in FIG. 3D, since the silicone rubber film 25 is formed into a cylinder whose tip is sealed and whose lower end is open, according to the shape of the three pins 11A, it may be fit into the through hole 21D. The silicone rubber film 25 expands and contracts readily as the three pins 11A move up and down, which allows the three pins 11A to go up and down smoothly.

With the embodiment, the wafer holding table can be used not only suitably as a wafer chuck 2 for test that causes a wafer W to make in-unison contact with the contactor but also widely as a carrier to transfer wafers one by one.

The wafer holding table of the invention and its related component parts are not restricted to those in the embodiment. Each component part may be changed as the occasion demands.

With the embodiment, because the pogo pin block 17 that supports the pogo pins 10 for connecting the contactor 3 to the connector is quadrisected, with a clearance δ between the divided parts, even when the pogo pin block 17 expands thermally as a result of the rise of the temperature in the temperature control compartment 1A, the thermal expansion of the pogo pin block 17 is small and the pogo pins 10 on the pogo pin block 17 contact the connection pads 3B of the contactor 3 reliably, assuring a stable electrical conduction between the pogo pins 10 and connection pads 3B, which increases the reliability of test.

While in the embodiment, the pogo pin block 17 has been quadrisected, it is not limited to quadrisection.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor wafer holding apparatus comprising:
   a semiconductor wafer holding table including a body on which a semiconductor wafer is to be placed, said body including holes which allow pins to receive the semiconductor wafer, thereby enabling the wafer to move up and down, and a seal film which covers the holes and expands and contracts as the pins go up and down; and
   a mechanism for adhering to the semiconductor wafer by vacuumization.

2. A semiconductor wafer holding apparatus according to claim 1, wherein said seal film is made of silicone rubber and is in the form of a cylinder whose tip is sealed and whose bottom end is open.

3. A semiconductor wafer holding apparatus comprising:
   a semiconductor wafer holding table for holding a semiconductor wafer, said semiconductor wafer holding table having a surface on which a semiconductor wafer is to be placed and at least one recessed section therein, the recessed section having a depth reaching close to the surface;
   a temperature measuring mechanism for measuring the temperature of the semiconductor wafer holding table, said temperature measuring mechanism including at least one temperature sensor and a first elastic support member which supports the temperature sensor, allows the temperature sensor to pass through the through hole in said temperature control mechanism, and fits the temperature sensor in the recessed section of said semiconductor wafer holding table; and
   a temperature control mechanism for controlling the temperature of the semiconductor wafer placed on the semiconductor wafer holding table, said temperature control mechanism controlling the temperature of said semiconductor wafer holding table while making contact with the side opposite to the surface of the semiconductor wafer holding table, supporting said semiconductor wafer holding table, and having at least one through hole in a position corresponding to said recessed section;
   wherein said temperature measuring mechanism is provided with a sensor for sensing the position of at least one temperature sensor.

4. A semiconductor wafer holding apparatus comprising:
   a contactor including a plurality of conducting means that make electrical contact, in unison and separately, with specific electrodes of semiconductor elements formed on a semiconductor wafer and external terminals electrically connected to the conducting means;
   a semiconductor wafer holding table for holding the semiconductor wafer in contact with said contactor, said semiconductor wafer holding table having a surface on which a semiconductor wafer is to be placed and at least one recessed section therein, the recessed section having a depth reaching close to the surface,
   a temperature measuring mechanism for measuring the temperature of the semiconductor wafer holding table, said temperature measuring mechanism including at least one temperature sensor and a first elastic support member which supports the temperature sensor, allows the temperature sensor to pass through the through hole in said temperature control mechanism, and fits the temperature sensor in the recessed section of said semiconductor wafer holding table; and
   a temperature control mechanism for controlling the temperature of the semiconductor wafer placed on the semiconductor wafer holding table, said temperature control mechanism controlling the temperature of said semiconductor wafer holding table while making contact with the side opposite to the surface of the semiconductor wafer holding table, supporting said semiconductor wafer holding table, and having at least one through hole in a position corresponding to said recessed section;
   wherein said temperature measuring mechanism is provided with a sensor for sensing the position of at least one temperature sensor.

5. A semiconductor wafer holding apparatus comprising:
   a contactor including a plurality of conducting means that make electrical contact, in unison and separately, with specific electrodes of semiconductor elements formed on a semiconductor wafer and external terminals electrically connected to the conducting means;
   a semiconductor wafer holding table for holding the semiconductor wafer in contact with said contactor;
   a temperature measuring mechanism for measuring the temperature the semiconductor wafer holding table; and
   a temperature control mechanism for controlling the semiconductor wafer placed on the semiconductor wafer holding table, said temperature control mechanism being supported by a support mechanism which includes
   a base in which through holes are made,
   rods that penetrate through the through holes in the base and are secured to said temperature control mechanism and that guide said base in such a manner the base can move relatively with respect to said temperature control mechanism, and
   a second elastic support member for supporting said temperature control mechanism elastically in a manner that leaves a space between the temperature control mechanism and said base.

6. A semiconductor wafer holding apparatus according to claim 5, wherein said second elastic support member is coil-like springs wound around said rods.

* * * * *